(12) United States Patent
Neidorff

(10) Patent No.: US 10,156,593 B2
(45) Date of Patent: Dec. 18, 2018

(54) METHOD AND CIRCUITRY FOR MEASURING CURRENT

(71) Applicant: Texas Instruments Incorporated, Dallas, TX (US)

(72) Inventor: Robert A. Neidorff, Bedford, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 358 days.

(21) Appl. No.: 15/188,578

(22) Filed: Jun. 21, 2016

(65) Prior Publication Data
US 2017/0363662 A1   Dec. 21, 2017

(51) Int. Cl.
*G01R 19/00* (2006.01)
*H03K 17/687* (2006.01)
*G01R 27/08* (2006.01)
*G01R 19/165* (2006.01)

(52) U.S. Cl.
CPC ......... *G01R 19/0092* (2013.01); *G01R 27/08* (2013.01); *H03K 17/687* (2013.01); *G01R 19/16519* (2013.01)

(58) Field of Classification Search
CPC ............ G01R 19/00; G01R 19/0084; G01R 19/0092; G01R 19/16516; G01R 27/00; G01R 27/08; G01R 27/26; G01R 31/00; G01R 31/002; G01R 31/08; G01R 31/2608; G01R 31/261; G01R 31/2621; G01R 31/2623; G01R 31/3191; G01R 33/0023; G01R 35/00; G01R 35/005; H03K 17/687

USPC ... 324/76.11, 500, 522, 537, 760.01, 760.02, 324/762.01, 762.08, 762.09, 600, 601, 324/649, 691, 713; 702/1, 57, 64
See application file for complete search history.

(56) References Cited

U.S. PATENT DOCUMENTS

| | | | | |
|---|---|---|---|---|
| 7,221,192 B1* | 5/2007 | Talbot | ............... | G01R 31/3163 327/407 |
| 8,022,734 B1* | 9/2011 | Broughton | .......... | H04L 25/0272 327/58 |
| 2001/0026189 A1* | 10/2001 | Kawabata | ............... | G05F 3/242 327/540 |
| 2010/0091567 A1* | 4/2010 | Tran | .................... | G11C 11/5621 365/185.03 |
| 2015/0061637 A1* | 3/2015 | Pigott | ............... | G01R 19/0084 324/76.11 |
| 2016/0189790 A1* | 6/2016 | Ma | ..................... | G11C 16/0483 365/185.25 |

* cited by examiner

*Primary Examiner* — Hoai-An D. Nguyen
(74) *Attorney, Agent, or Firm* — Tuenlap D. Chan; Charles A. Brill; Frank D. Cimino

(57) ABSTRACT

Transistor arrays are disclosed herein. An example transistor array includes a first node for coupling the transistor array to a circuit. A first transistor and a second transistor are coupled to the first node. A gate controller is coupled to the gate of the first transistor and the gate of the second transistor and is for selectively turning on the first transistor and the second transistor. A current source is coupled to the first node and is active when the second transistor is off. Calibration circuitry measures the voltage of the first node when the current source is active.

20 Claims, 3 Drawing Sheets

US 10,156,593 B2

METHOD AND CIRCUITRY FOR MEASURING CURRENT

BACKGROUND

It is often necessary to closely monitor or sense the current flow through some critical circuit paths in order to make appropriate power management decisions and to maximize the performance of the circuit. One method of sensing current is to add a resistor in series with the current path. The voltage drop across the resistor is proportional to the current flow through the resistor. The added resistor is inefficient in that a resistance is added to the circuit, which reduces the current flow and increases power losses.

One method of sensing current through a power transistor, such as a power metal oxide semiconductor field-effect transistor (MOSFET) uses SenseFET technology. A SenseFET circuit is essentially comprised of two matched transistors, such as two MOSFETs. One transistor is the main current-carrying power transistor and the other transistor is a much smaller sensing transistor. The circuit includes a small number of source cells that are isolated from the rest of the source cells and connected to a separate sense pin, which creates a matched mirror transistor. The ratio of source cells to sense cells is typically very large, so when current flows through the main transistor of the source cells, a much smaller current flows through the mirror transistor. The ratio of current through the main transistor to the current through the mirror transistor is referred to as the current ratio, and is typically about 400:1. The current flow through the sensed transistor is measured, such as by measuring the drain/source voltage, which provides an indication of the current flow through the main transistor. SenseFET technology is more efficient than a current sense resistor, but is limited by the ability to match the power transistor to the sensing transistor. It also has limited accuracy because the resistance of the transistors typically change over time, so measuring the drain/source voltage to obtain current typically will not be accurate over time.

Some power transistors are fabricated using laterally diffused metal oxide semiconductor (LDMOS) techniques that change characteristics with time if they are switched with high voltage on their drains. In some embodiments, the change in characteristics happens quickly at first then tapers off with time, resulting in a change that is a logarithmic function of time. Other embodiments have different aging profiles that are not easily predicted. For example, baking LDMOS devices or operating the devices in different modes can reverse or accelerate changes in characteristics. These changes present problems with devices used in SenseFET technology because a change in the current ratio leads to inaccurate current sensing.

SUMMARY

Transistor arrays are disclosed herein. An example transistor array includes a first node for coupling the transistor array to a circuit. A first transistor and a second transistor are coupled to the first node. A gate controller is coupled to the gate of the first transistor and the gate of the second transistor and is for selectively turning on the first transistor and the second transistor. A current source is coupled to the first node and is active when the second transistor is off. Calibration circuitry measures the voltage of the first node when the current source is active.

DETAILED DESCRIPTION

Many high power circuits, such as DC-to-DC converters require monitoring or sensing of current flow through some critical circuit paths in order to make appropriate power management decisions and to maximize the performance of the circuit. SenseFET technology is a method of sensing current through a power transistor, such as a power metal oxide semiconductor field-effect transistor (MOSFET). A SenseFET circuit includes two matched transistors, such as two MOSFETs. A power transistor is the main current-carrying transistor and the other transistor is a much smaller sensing transistor. The SenseFET circuit includes a small number of source cells that are isolated from the rest of the source cells and connected to a separate sense pin, creating the sensing transistor, which is a matched mirror transistor. The ratio of source cells to sense cells is typically very large, so when current flows through the power transistor, a much smaller current flows through the sensing transistor. The ratio of current through the power transistor to the current through the sensing transistor is referred to the current ratio, and is typically about 400:1. The current flow through the sensing transistor is sensed, such as by measuring the drain/source voltage of the sensing transistor, which provides an indication of the current flow through the power transistor. The gate voltage of the power transistor may then be modified to control the current flow through the power transistor. SenseFET technology is more efficient than a current sensing resistor, but is limited by the ability to match the power transistor to the sensing transistor.

Some power transistors are fabricated using laterally diffused metal oxide semiconductor (LDMOS) techniques. Power transistor fabricated with LDMOS techniques are known to change characteristics over time, especially if they are switched with high voltages on their drains. In some embodiments, the change in characteristics happens quickly at first, and then the change tapers off with time, resulting in a change that is a logarithmic function of time. Other change characteristics have different aging profiles that are not easily predicted. For example, baking LDMOS devices or operating the devices in different modes can reverse or accelerate the changes in their characteristics. These changes present problems with devices used in SenseFET technology because they cause changes in the current ratio, which leads to inaccurate current sensing.

Figure 1:
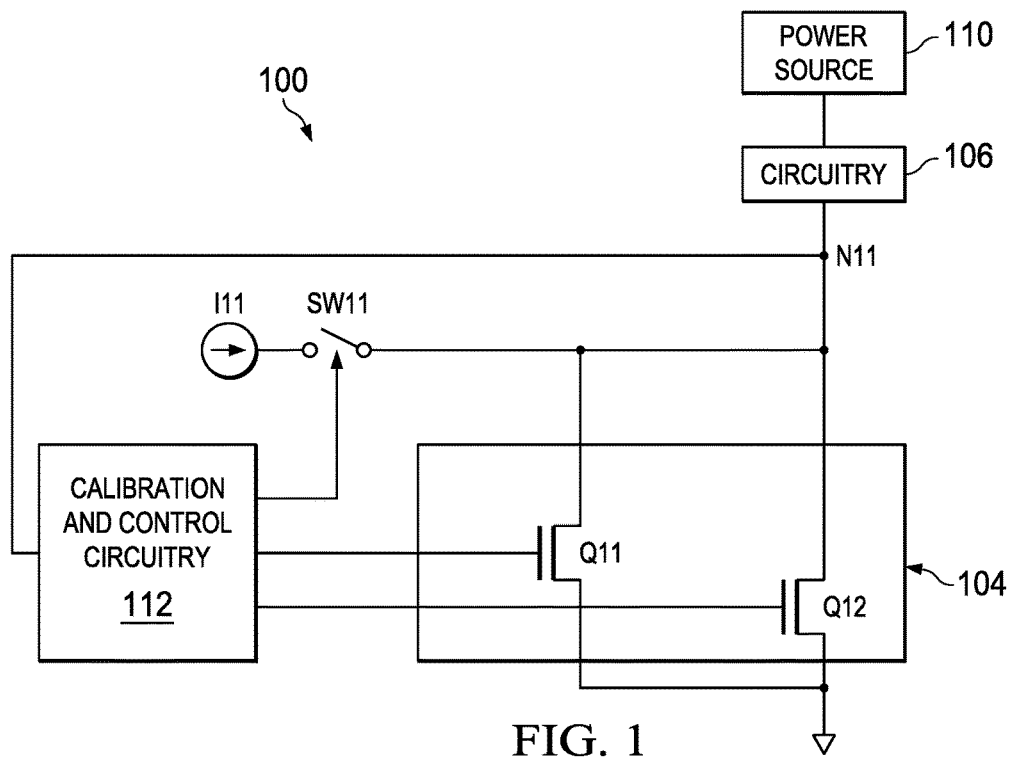
FIG. 1 is a block diagram of an example circuit that senses current flow in an array of transistors.

Components, circuits, and methods that resolve the above-described problems are disclosed herein. FIG. 1 is a block diagram of a circuit 100 that senses current flow in an array of power transistors 104 and overcomes the above-described problems with SenseFET technology and LDMOS devices. The array of power transistors 104 includes at least one first transistor, represented by a first transistor Q11, and at least one second transistor, represented by a second transistor Q12. The transistors Q11 and Q12 in the example of FIG. 1 are N-channel devices with their drains coupled to circuitry 106 by way of a node N11 and their sources coupled to a common node, such as ground. In some examples, the transistors Q11 and Q12 are MOSFETs and may be fabricated per LDMOS techniques. The circuitry 106 is any circuitry that has current to be measured. An example of the circuitry is at least a portion of a high power DC-to-DC converter that requires significant current, such as current as high as 10 A, to flow through the transistor array 104. A power supply 110 supplies power to the circuitry 106.

Calibration and control circuitry 112 is coupled to the gates of transistors Q11 and Q12 and to node N11. The circuitry 112 is also coupled to a switch SW11 that is coupled to a current source I11. The current source I11 supplies a predetermined current to the first transistor Q11 when the switch SW11 is closed as described herein. During normal operation of the circuitry 106, both the first transistor Q11 and the second transistor Q12 are on or are turned on simultaneously and the switch SW11 is open. During calibration of the transistor array 104, the first transistor Q11 is turned on, the second transistor Q12 is turned off, and the switch SW11 is closed. In some examples, a switch is provided to prevent the current generated by the current source I11 from leaking into the circuitry 106. The voltage generated across the drain and source of the first transistor Q11 is proportional to the resistance of the first transistor Q11. Because the current generated by the current source I11 is known, the voltage generated across the first transistor Q11 readily yields the on-resistance of the transistor Q11. The first and second transistors Q11 and Q12 age significantly the same, so the on-resistance of the first transistor Q11 is substantially proportional to or substantially the same as the on-resistance of the second transistor Q12. By knowing the on-resistances of the transistors in the transistor array 104, the circuitry 112 determines the current flow through the transistor array 104 by measuring the voltage at node N11 during normal operation of the circuitry 106.

The current generated by the current source I11 is typically significantly less than the current flow through the transistor array 104 during normal operation of the circuitry 106. For this reason, fewer than all the transistors in the transistor array 104 are turned on during calibration so that a relatively high voltage is generated by the current generated by the current source I11. The small current source I11 enables it to be located on the same circuit as the circuitry 112, which alleviates the need for a separate circuit for the current source I11.

Figure 2:
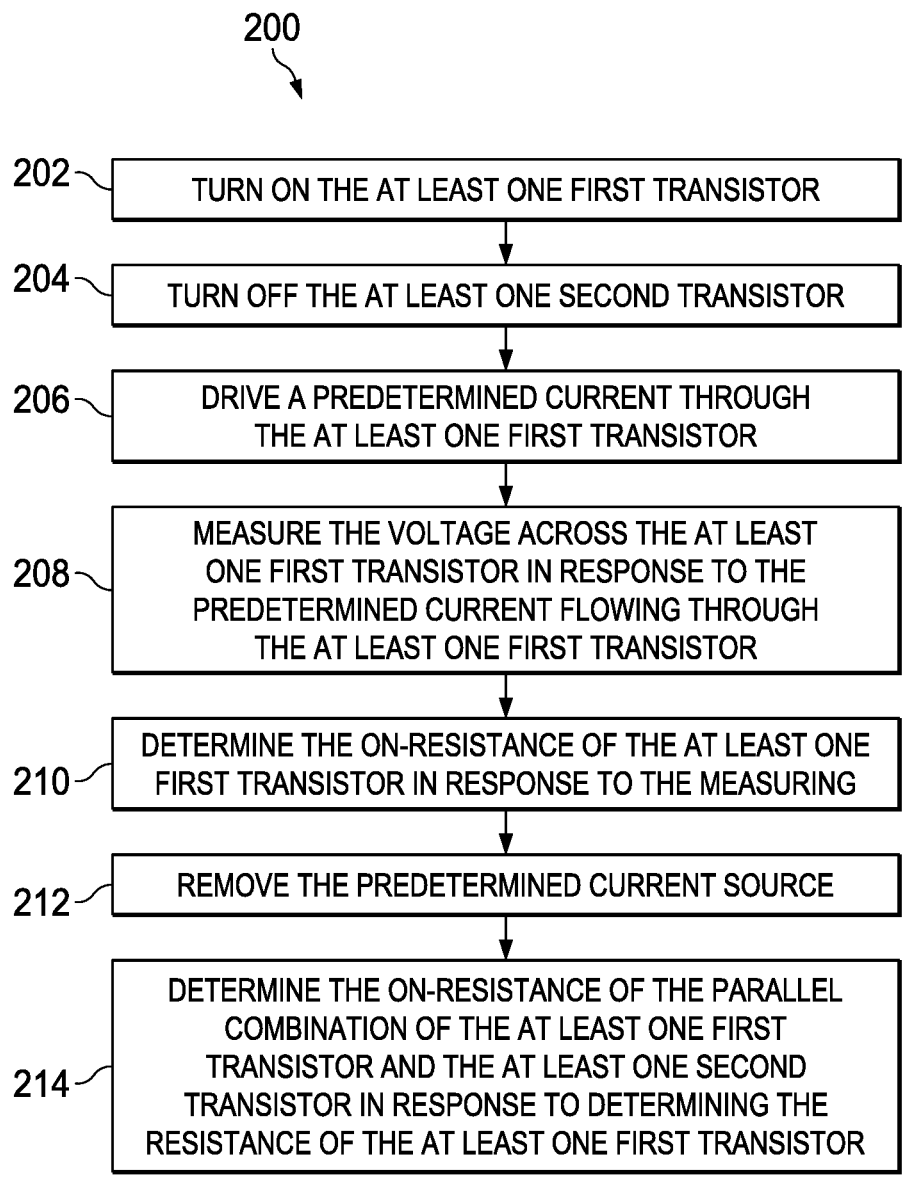
FIG. 2 is a flowchart describing an example method of operating the circuitry of FIG. 1.

FIG. 2 is a flowchart 200 describing an example method of operating the circuit 100 of FIG. 1. The flowchart 200 commences at step 202 with turning on the at least one first transistor Q11. Step 204 includes turning off the at least one second transistor Q12. When the at least one first transistor Q11 is turned on and the at least one second transistor Q12 is turned off, the circuitry 100 is in the calibration mode. Step 206 includes driving a predetermined current through the at least one first transistor Q11. In the example of FIG. 1, the predetermined current is the current generated by the current source I11 and it is driven through transistor Q11 by closing switch SW11. Step 208 includes measuring the voltage across the at least one first transistor in response to the predetermined current flowing through the at least one first transistor Q11. The on-resistance of the at least one first transistor Q11 is determined at step 210 in response to the measuring of the voltage across the at least one first transistor Q11. For example, the voltage and current are known, so the on-resistance is readily determined by Ohm's law. In step 212, the predetermined current source is removed, which is achieved in FIG. 1 by opening the switch SW11. Step 214 includes determining the on-resistance of the parallel combination of the at least one first transistor Q11 and the at least one second transistor Q12 in response to determining the resistance of the at least one first transistor Q11. For example, all the transistors are substantially similar, so they have substantially similar on-resistances. The parallel combination of the transistors is therefore determined by Kirchhoff's law. The drain/source voltage across the transistor array 104 is measured during normal operation of the circuit 100, which yields the current flow through the transistor array 104.

Figure 3:
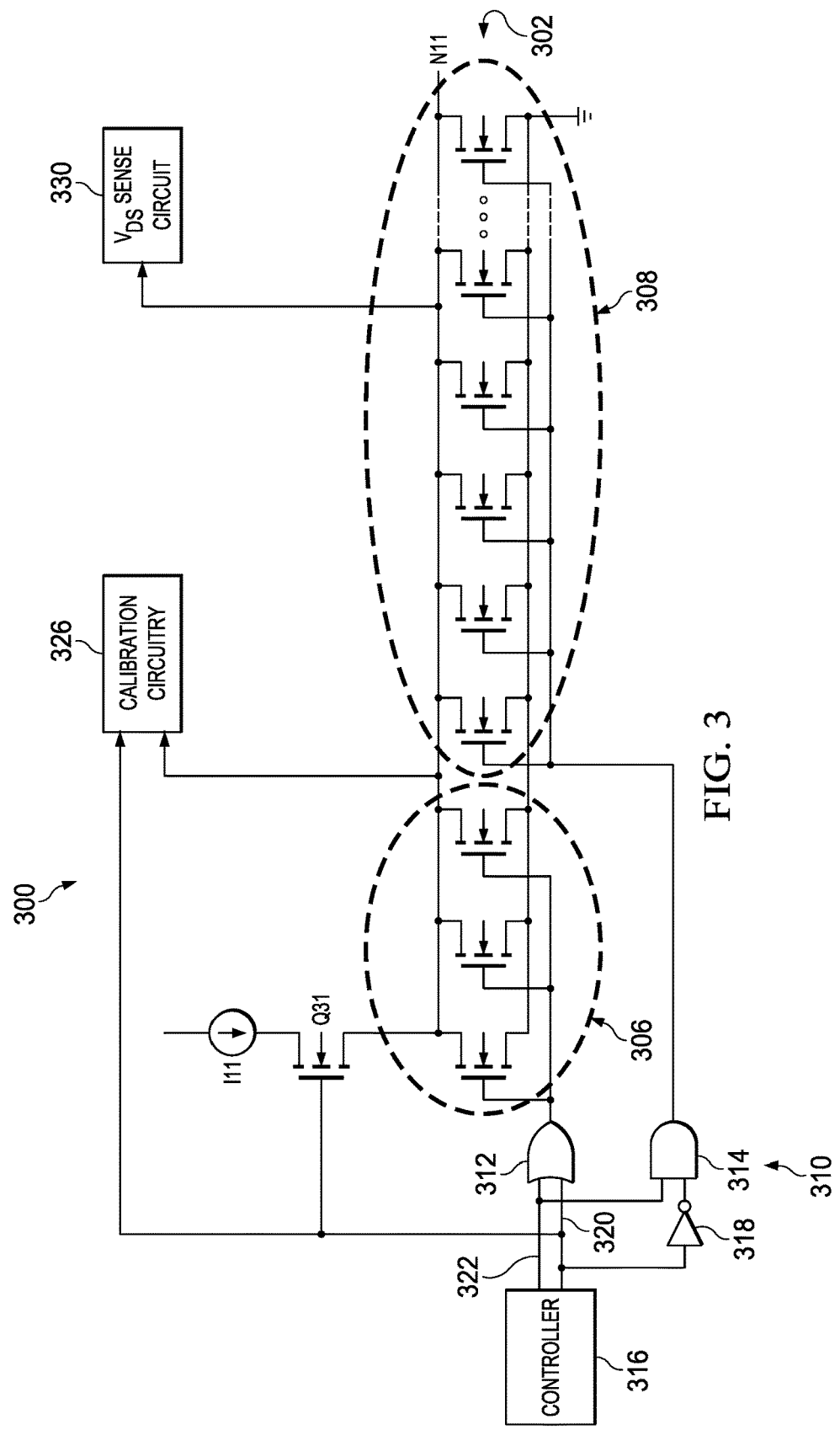
FIG. 3 is a schematic diagram of a detailed example of the calibration and control circuitry and the array of power transistors of FIG. 1.

FIG. 3 is a schematic diagram of a detailed example of circuitry 300 of the calibration and control circuitry 112 of FIG. 1. The circuitry 300 includes an array of transistors 302 that is divided into a first group of transistors 306 and a second group of transistors 308. The transistors in the array of transistors 302 are constructed using similar technology. For example, all the transistors may all be N-channel MOSFETs fabricated using LDMOS technology and located on the same die. The drains of all the transistors are coupled to node N11, which correlates to node N11 of FIG. 1. The sources of all the transistors are coupled to a common node, such as ground. During normal operation, the transistor array 302 functions as a single power transistor. The current source I11 is coupled to node N11 by way of a transistor Q31, wherein transistor Q31 functions as the switch SW11 of FIG. 1. Accordingly, transistor Q31 is on during the calibration mode, which activates the current source I11, and off during normal operation.

The gates of the transistors are coupled to logic circuitry 310 that selectively turns on the first group of transistors 306 and the second group of transistors 308. The logic circuitry 310 is an example of many different circuits that may perform the functions described with regard to the logic circuitry 310, such as selectively controlling the gates of transistors in the transistor array 302. The gates of the first group of transistors 306 are coupled to the output of an OR gate 312 and the gates of the second group of transistors 308 are coupled to the output of an AND gate 314.

The inputs of the OR gate 312 and the AND gate 314 are coupled to a controller 316 and an inverter 318. The controller 316 has a first output 320 and a second output 322. The first output 320 generates a logic one signal during the calibration phase as described herein and a logic zero at other times, such as during normal operation of the circuitry 300. The second output 322 generates a logic one during periods when any of the transistors are to be on, such as during normal operation and calibration modes. For example, the second output 322 generates a logic zero at times when none of the transistors are to be on, such as during periods of normal operation of the circuitry 106, FIG. 1. The first output 320 is also coupled to calibration circuitry 326, which is also coupled to node N11. The signal generated by the first output 320 triggers the calibration circuitry 326 to commence and/or perform calibration. During normal operation, a $V_{DS}$ sense circuit 330 monitors the drain/source voltage across the transistors in the transistor array 302. In some examples, the calibration circuitry 326 and the $V_{DS}$ sense circuit 330 may be a single circuit or their functions may be performed by a single processor.

Having described the components of the circuitry 300, its operation will now be described. During normal operation, the first output 320 generates a logic zero and the second output 322 generates a logic one during periods that the transistors in the transistor array 302 are to be on. These logic signals cause the gates of all the transistors in the transistor array 302 to be high, which turns them on. In some examples such as when the circuitry 300 is used in conjunction with a DC-to-DC power supply, the transistors are modulated, so the signal generated at the second output 322 may be a pulse width modulated signal or other modulated signal. The gate of transistor Q31 is low, so it is off, which prevents the current source I11 from coupling to node N11. The current source I11 is referred to being inactive when transistor Q31 is off. The calibration circuitry 326 is inactive during normal operation and the $V_{DS}$ sense circuit 330 is actively measuring the voltage $V_{DS}$ at node N11.

At some time, the circuitry 300 enters the calibration mode. This time may be periodic or triggered by an event such as startup of the circuitry 300. The circuitry 300 enters the calibration mode by switching the logic state at the first output 320 to high. As shown by the logic circuitry 310, this logic configuration turns off the second group of transistors 308 and leaves the first group of transistors 306 on. The high logic signal at the first output 320 turns transistor Q31 on so as to couple the current source I11 to node N11 and enable the calibration circuitry 326. When transistor Q31 is on, the current source I11 is referred to as being active.

The current source I11 is calibrated to generate a precise and predetermined current. In some examples, the current source I11 is calibrated during fabrication of the circuitry 300. In other examples, the current source I11 is calibrated or otherwise measured by other circuitry (not shown) coupled to the circuitry 300. In yet other examples, the current generated by the current source I11 is measured and stored, such as in the calibration circuitry 326. In any event, the current source I11 generates a precise and predetermined current that is driven through the first group of transistors 306 during the calibration mode. In some examples, circuits and other devices are decoupled from node N11 or deactivated to prevent the current generated by the current source I11 from leaking out of the circuitry 300. In other examples, the on-resistance of the first group of transistors 306 is much less than the resistance of those circuits, so any current leakage into those circuits is negligible.

The current passing through the first group of transistors 306 generates a voltage that is proportional to the on-resistance of the first group of transistors 306. The use of only a few of the transistors in the transistor array 302 during the calibration mode enables the voltage generated by the current source I11 to be high enough to be measured accurately in situations where the on-resistance of the first group of transistors 306 is substantially low. This voltage is measured by the calibration circuitry 326. By application of Kirchhoff's law, the on-resistance of a single transistor in the transistor array 302 is readily determined. Another application of Kirchhoff's law yields the on-resistance of the transistor array 302. The on-resistance of the transistor array 302 serves as a basis for current sensing measurements when the circuitry 300 is operated in the normal mode. More specifically, the $V_{DS}$ sense circuit 330 measures the drain/source voltage of the transistor array 302 in the normal mode. Because voltage and resistance are known, the current flowing through the transistor array 302 is readily determined by application of Ohm's law. The current measurement is made accurately, irrespective of aging or other adverse conditions to the transistors in the transistor array 302.

In some examples, the selection of when to enter the calibration mode is determined by the end use of the system in which the circuitry 300 is located. The selection may be frequent enough to track aging of the transistors, but not frequent enough so as to interfere with normal operation of the circuitry 300. For example, the calibration mode could be 10 us long and could occur once per hour. In another example, the calibration mode occurs every time the circuitry 300 receives a specific command, such as a disable command. In some examples, the circuitry 300 enters the calibration mode every time that the circuitry 300 or circuits coupled to the circuitry 300 have an event, such as an over-current fault or programmed output voltage change. In yet another example, the calibration mode occurs every time that the circuitry 300 or a circuit coupled thereto receives a request for precise measurement of current flowing through the transistor array 302.

Figure 4:
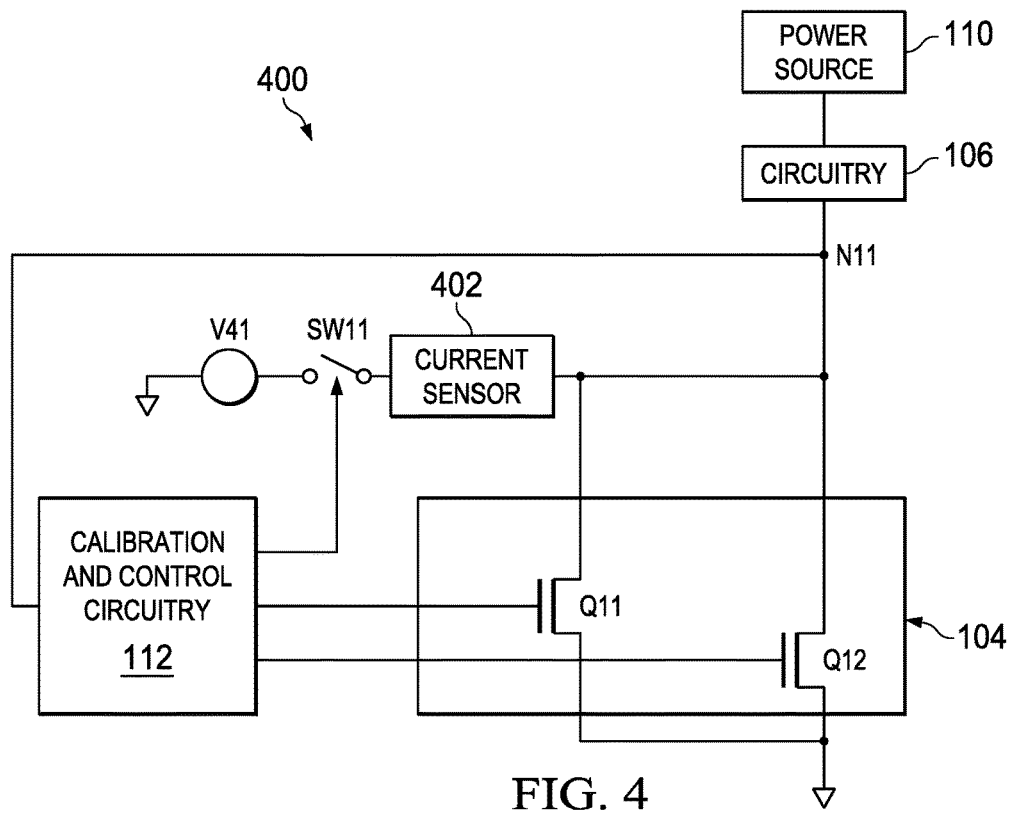
FIG. 4 is a block diagram of an example circuit that senses current flow in an array of transistors.

FIG. 4 is block diagram representing an example of circuitry 400 that applies a predetermined voltage between the drains and sources of the transistors in the transistor array 302 instead of applying the above-described current source I11. The circuitry 400 is substantially similar to the circuitry 100 of FIG. 1, except the current source I11, FIG. 1, has been replaced with a voltage source V41 and a current sensor 402 is coupled in series with the voltage source V41. The voltage source V41 is calibrated to generate a precise and predetermined voltage in a similar manner that the current source I11 generates a precise and predetermined current. The first transistor Q11 draws current that is inversely proportional to its on-resistance. By measuring the current drawn by transistor Q11 during the calibration mode, the on-resistance of transistor Q11 is readily determined. The techniques described above are applied to the transistor array 104 to determine the on-resistance of all the transistors based on the on-resistance of transistor Q11.

In another embodiment, drive current or saturation current can be calibrated. In saturation, the drain current is nearly independent of drain voltage. It is not practical to measure saturation current by applying a precise current to the transistors. Saturation current is measured by turning the first group of transistors 308 partially on, applying a predetermined voltage to their drains, and measuring the drain current drawn by all the transistors in the first group of transistors. Saturation current is only measured by applying a voltage to the drains of the transistors and measuring drain current.

The circuitry 300 provides that the transistors in the transistor array 302 are always calibrated or that the on-resistance of the transistors is always known. This calibration applies even as the transistors age. Furthermore, the calibration is achieved on the transistors that are subjected to normal operating conditions, which provides a more accurate calibration. The calibration is also more efficient than conventional calibration or current sensing techniques because there is not additional shunt resistance or current sensing resistance required. In another improvement, the calibration may be accomplished at the operating temperature of the transistors in the transistor array 302, which provides a more accurate calibration.

While illustrative and presently preferred embodiments of current sensors and transistor arrays have been described in detail herein, it is to be understood that the concepts may be otherwise variously embodied and employed and that the appended claims are intended to be construed to include such variations except insofar as limited by the prior art.

What is claimed is:

1. A transistor array comprising:
   a node for coupling the transistor array to a circuit;
   a first transistor coupled to the node;
   a second transistor coupled to the node;
   a gate controller coupled to the gate of the first transistor and the gate of the second transistor, the gate controller for selectively turning on the first transistor and the second transistor;

a current source coupled to the node, the current source being active when the second transistor is off and the first transistor is on; and calibration circuitry for measuring the voltage of the node when the current source is active.

2. The transistor array of claim 1, wherein the circuit is a DC-to-DC converter.

3. The transistor array of claim 1, wherein the circuit generates a current to flow through the first transistor and the second transistor, and wherein current generated by the current source is less than the current generated by the circuit.

4. The transistor array of claim 1, further comparing at least one transistor coupled in parallel with the first transistor.

5. The transistor array of claim 1, further comparing at least one transistor coupled in parallel with the second transistor.

6. The transistor array of claim 1, wherein the current source is coupled to the node by way of a switch and wherein the current source is active when the switch is closed.

7. The transistor array of claim 1, further comprising circuitry for determining the on-resistance of the first transistor in response to measuring the voltage at the node.

8. The transistor array of claim 7, further comprising circuitry for determining the on-resistance of the combination of the first transistor and the second transistor in response to the determining the on-resistance of the first transistor.

9. A transistor array comprising:
a node for coupling the transistor array to a circuit;
a first transistor coupled to the node;
a second transistor coupled to the node;
a gate controller coupled to the gate of the first transistor and the gate of the second transistor, the gate controller for selectively turning on the first transistor and the second transistor;
a voltage source coupled to the node, the voltage source being active when the second transistor is off and the first transistor is on; and
calibration circuitry for measuring the current drawn by the first transistor when the voltage source is active.

10. The transistor array of claim 9, wherein the circuit is a DC-to-DC converter.

11. The transistor array of claim 9, wherein the circuit generates a current to flow through the first transistor and the second transistor, and wherein current generated by the voltage source is less than the current generated by the circuit.

12. The transistor array of claim 9, further comparing at least one transistor coupled in parallel with the first transistor.

13. The transistor array of claim 9, further comparing at least one transistor coupled in parallel with the second transistor.

14. The transistor array of claim 9, wherein the voltage source is coupled to the node by way of a switch and wherein the voltage source is active when the switch is closed.

15. The transistor array of claim 9, further comprising circuitry for determining the on-resistance of the first transistor in response to measuring the current drawn by the first transistor.

16. The transistor array of claim 15, further comprising circuitry for determining the on-resistance of the combination of the first transistor and the second transistor in response to the determining the on-resistance of the first transistor.

17. The transistor array of claim 9, further comprising circuitry for determining the saturation current of the first transistor, the circuitry partially turning on the first transistor, activating the voltage source, wherein the calibration circuitry measures the current drawn by the first transistor.

18. A method for operating a current sensor, the current sensor comprising at least one first transistor and at least one second transistor coupled in parallel, the method comprising:
turning on the at least one first transistor;
turning off the at least one second transistor;
driving a predetermined current through the at least one first transistor;
measuring the voltage across the at least one first transistor in response to the predetermined current flowing through the at least one first transistor; and
determining the on-resistance of the at least one first transistor in response to the measuring.

19. The method of claim 18, further comprising determining the on-resistance of the parallel combination of the at least one first transistor and the at least one second transistor in response to determining the resistance of the at least one first transistor.

20. The method of claim 18, further comprising:
turning on the at least one first transistor;
turning on the at least one second transistor;
measuring the voltage across the at least one first transistor and the at least on second transistor; and
determining the current flow through the at least one first transistor and second transistor in response to determining the on-resistance of the parallel combination of the at least one first transistor and the at least one second transistor.

* * * * *